United States Patent
Chakraborty et al.

(10) Patent No.: US 11,714,443 B2
(45) Date of Patent: *Aug. 1, 2023

(54) TEMPERATURE INTERPOLATION TECHNIQUES FOR MULTIPLE INTEGRATED CIRCUIT REFERENCES

(71) Applicant: Micron Technology, Inc., Boise, ID (US)

(72) Inventors: Anupriya Chakraborty, Boise, ID (US); John David Porter, Boise, ID (US); Alan John Wilson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/666,124

(22) Filed: Feb. 7, 2022

(65) Prior Publication Data
US 2022/0261027 A1 Aug. 18, 2022

Related U.S. Application Data

(63) Continuation of application No. 16/983,811, filed on Aug. 3, 2020, now Pat. No. 11,243,554.

(51) Int. Cl.
*G05F 3/20* (2006.01)
*G11C 5/14* (2006.01)

(52) U.S. Cl.
CPC ............. *G05F 3/20* (2013.01); *G11C 5/147* (2013.01)

(58) Field of Classification Search
CPC ......... G05F 3/20; G11C 5/147; G11C 29/021; G11C 29/028; G11C 29/12005; G11C 29/16; G11C 29/20; G11C 7/04; G11C 16/10; G11C 16/30
See application file for complete search history.

(56) References Cited

U.S. PATENT DOCUMENTS

| | | | |
|---|---|---|---|
| 11,243,554 B1 * | 2/2022 | Chakraborty | .......... G11C 29/20 |
| 2011/0110164 A1 | 5/2011 | Jeong | |
| 2013/0136149 A1 | 5/2013 | Soenen et al. | |
| 2017/0115342 A1 | 4/2017 | Wang | |
| 2019/0170592 A1 * | 6/2019 | Jeong | ....................... G01K 7/01 |
| 2022/0035396 A1 | 2/2022 | Chakraborty et al. | |

* cited by examiner

*Primary Examiner* — Metasebia T Retebo
(74) *Attorney, Agent, or Firm* — Schwegman Lundberg & Woessner, P.A.

(57) ABSTRACT

Techniques for providing temperature trim codes to multiple reference circuits of an integrated circuit are provided. In an example, a string of primary latch circuits can provide a set of pre-defined temperature trim codes to a multiplexer in response to a token of a series of tokens. The multiplexer can provide two trim of the trim codes to an interpolator based on a temperature reading of the integrated circuit. The interpolator can provide an interpolated trim code and the trim code can be distributed to a reference circuit based on the token.

20 Claims, 6 Drawing Sheets

TEMPERATURE INTERPOLATION TECHNIQUES FOR MULTIPLE INTEGRATED CIRCUIT REFERENCES

PRIORITY APPLICATION

This application is a continuation of U.S. application Ser. No. 16/983,811, filed Aug. 3, 2020, which is incorporated herein by reference in its entirety.

TECHNICAL FIELD

Embodiments described herein generally relate to integrated circuits (ICs) and more particularly to trimming voltage references of an IC based on temperature.

BACKGROUND

Voltage or current references, and the associated circuits to generate the reference, are common components of integrated circuits (ICs). An individual IC can have multiple reference circuits. Operation and accuracy, or resolution, of a particular IC can depend on the specific level provided by a reference circuit. Temperature is an environmental condition that can cause a reference level to drift from the intended reference level. A conventional technique for compensating a reference level based on temperature can include storing temperature trim values or temperature trim codes in non-volatile memory indexed, for example, by temperature over a range of temperatures. The IC can include a temperature sensor or can receive an indication of ambient temperature of the IC and can interpolate a trim code to apply to the reference circuit based on for example, two stored trim codes associated with temperature indexes closest to the temperature indication. The interpolated trim code can then be applied to the reference circuit to adjust the reference level to the expected reference level. Application of a trim code to adjust a reference circuit can be accomplished in several ways that are known to those of skill in the art.

Memory device are just one of many types of ICs that can include multiple reference circuits. Memory devices are typically provided as internal, semiconductor, integrated circuits in computers or other electronic devices. There are many different types of memory, including volatile and non-volatile memory. Volatile memory requires power to maintain its data, and includes random-access memory (RAM), in various forms, such as dynamic random-access memory (DRAM) or synchronous dynamic random-access memory (SDRAM), among others. Non-volatile memory may retain stored data when not powered (may be implemented as read-only memory (ROM) in some cases), and may include one or more storage technologies, such as flash memory (e.g., NAND or NOR flash), electrically erasable programmable ROM (EEPROM), static RAM (SRAM), Ferroelectric RAM (FeRAM), erasable programmable ROM (EPROM), resistance variable memory, such as phase-change random-access memory (PCRAM), resistive random-access memory (RRAM), magnetoresistive random-access memory (MRAM), or 3D XPoint™ memory, among others.

Flash memory is utilized as non-volatile memory for a wide range of electronic applications. Flash memory devices typically include one or more groups of one-transistor, floating gate, or charge trap memory cells that allow for high memory densities, high reliability, and low power consumption. Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a bit line.

Accuracy and reliability of a memory circuit, as well as other types of ICs, can depend on accurate reference levels. However, conventional techniques for compensating a reference level due to temperature employ an interpolator circuit and a number of local latches for each reference circuit provided on the IC. such a temperature compensation scheme occupies significant resources and area of the IC.

BRIEF DESCRIPTION OF THE DRAWINGS

In the drawings, which are not necessarily drawn to scale, like numerals can describe similar components in different views. Like numerals having different letter suffixes can represent different instances of similar components. The drawings illustrate generally, by way of example, but not by way of limitation, various embodiments discussed in the present document.

DETAILED DESCRIPTION

Figure 1:
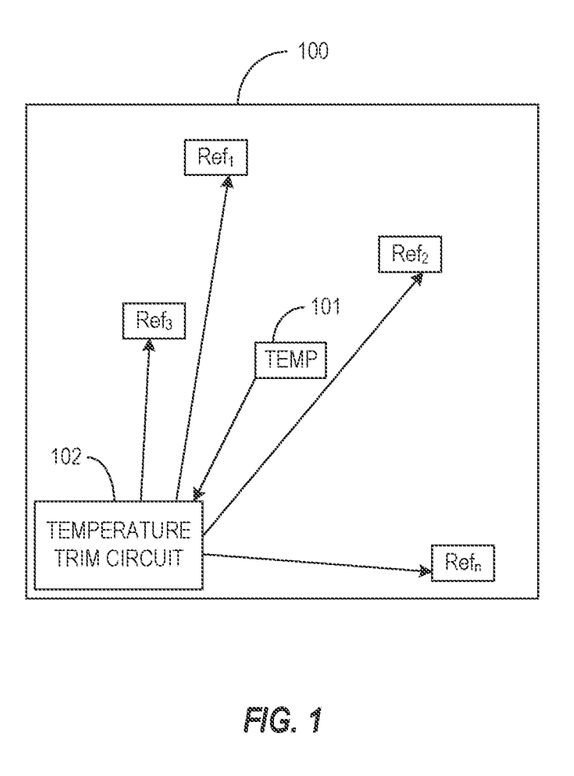
FIG. 1 illustrates generally a block diagram of an example integrated circuit (IC).

FIG. 1 illustrates generally a block diagram of an example integrated circuit (IC) 100. The IC 100 can include a number of reference circuits ($Ref_1$, $Ref_2$, $Ref_3$, . . . , $Ref_n$), a temperature sensor 101, and a trim circuit 102. The IC 100 can include other circuitry specific to the functions performed by the IC 100 but those circuits are not shown in FIG. 1. In certain examples, the IC 100 can be a memory device but the present subject matter is not so limited. The reference circuits ($Ref_1$, $Ref_2$, $Ref_3$, . . . , $Ref_n$) can provide reference levels of certain operational characteristics to assist the operation of the IC 100. Such operational characteristics can include, but are not limited to supply voltages, supply current, reference voltages, and reference currents. In some examples, the consistency of level of the operating characteristic can determine the performance limits of the IC 100. Temperature change can affect the level of many operating characteristics of an IC 100 and can cause reference levels to drift from the desired level. Alternatively, a temperature slope on a reference level may be desired. One method of temperature compensation is to dynamically trim each individual reference circuit based on a representation of an ambient temperature provided by the temperature sensor 101 of the IC 100. Conventional methods of dynamic temperature compensation trimming can include storing predetermined trim codes based on circuit testing for each voltage reference ($Ref_1$, $Ref_2$, $Ref_3$, ..., $Ref_n$) of the IC 100. A set of predetermined trim codes for one reference circuit can include multiple, multiple-bit codes indexed by temperature. The predetermined trim codes can be programmed into a broadcast block of non-volatile registers, primary latches or fuse registers at production to become preprogrammed temperature trim codes. Upon start-up of the IC, the trim codes for each reference circuit can be transferred from the broadcast block to local latches near the corresponding reference circuit. As the IC 100 operates, and upon receiving a temperature reading from the temperature sensor 101 at each reference circuit ($Ref_1$, $Ref_2$, $Ref_3$, ..., $Ref_n$), a local interpolator circuit can receive two predetermined trim codes associated with temperatures nearest the temperature reading and can interpolate a final trim code that can be passed to the trim circuitry of the corresponding reference circuit ($Ref_1$, $Ref_2$, $Ref_3$, ..., $Ref_n$). As an example, for an IC that includes 6 reference circuits and can store 21 predetermined, 6-bit, trim codes for each reference circuit, the temperature trim compensation architecture can include the broadcast block, 736 local latches, 6 multiplexers (e.g., 21:2 multiplexers), six interpolators, and can occupy an area of ~48000 um² of the IC.

Figure 2:
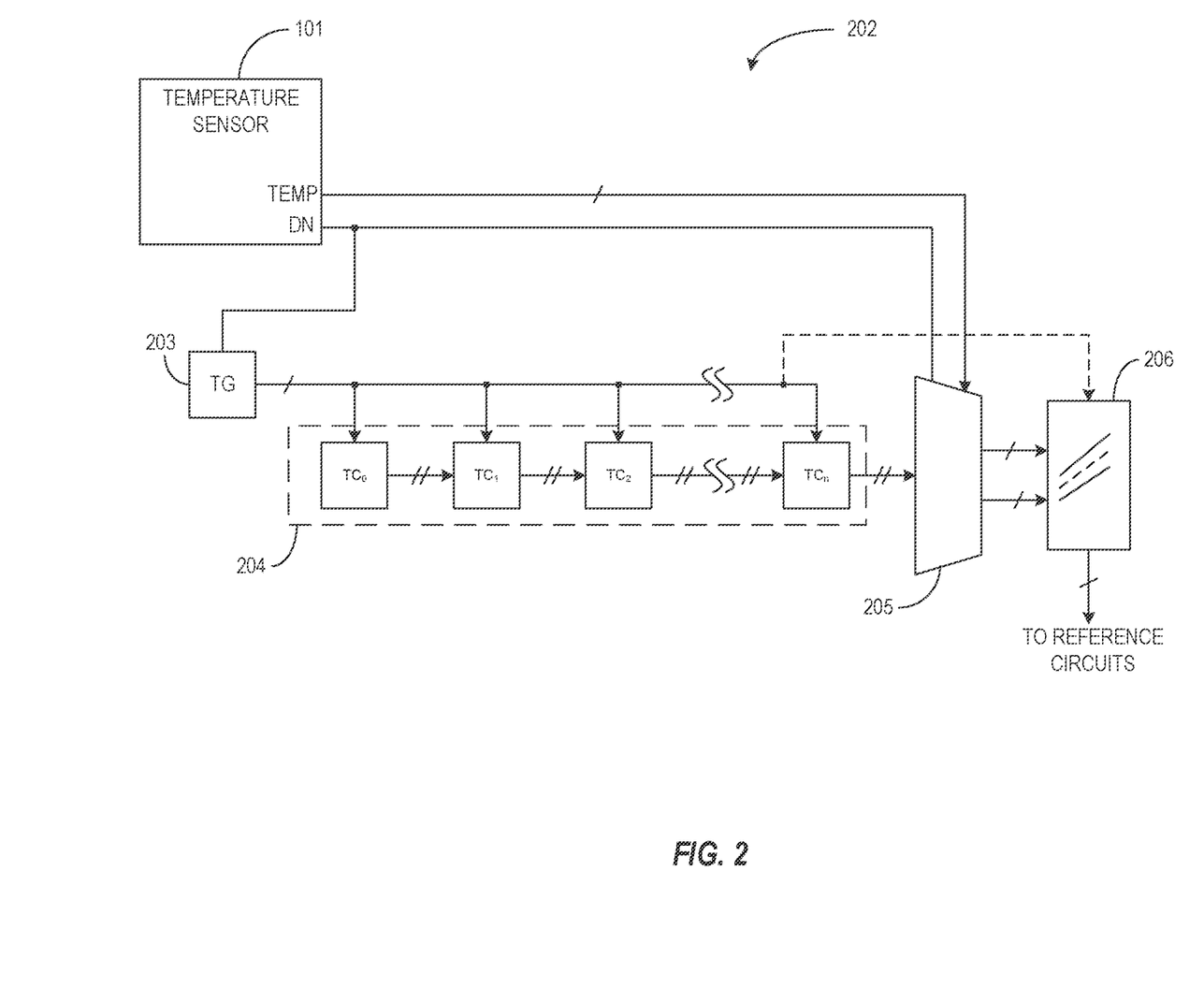
FIG. 2 illustrates generally a block diagram of a temperature trim code architecture for multiple-reference ICs.

The present inventors have recognized techniques to significantly reduce the size of a temperature trim architecture for a multiple-reference IC while not significantly reducing the performance of the reference circuit trimming function. In addition, an example architecture allows for very clean integration of additional reference circuits. FIG. 2 illustrates generally a block diagram of a temperature trim code architecture 202 for multiple-reference ICs. For simplicity, the block diagram of the temperature trim code architecture 202 does not include the reference circuits or the actual trimming circuits for the reference circuits, but does indicate how an interpolated temperature trim code can be distributed to a local latch at each of the reference circuits. In certain examples, the temperature trim code architecture 202 can include or be coupled to a temperature sensor 101. The temperature trim code architecture 202 can include a token generator 203, a string 204 of multiple primary latch circuits ($TC_x$), a multiplexer 205, and an interpolator 206. In some examples, a single IC, such as a memory IC, can include the above described components of the temperature trim code architecture, the multiple reference circuits, and a local latch circuit for each reference circuit. In certain examples, the memory IC can include, but is not limited to, flash memory, EPROM, EEPROM, SRAM, FeRAM, resistance variable memory, such PCRAM, RRAM, MRAM, or 3D XPoint™ memory, among others.

The temperature sensor 101 can make periodic measurements of a temperature of the IC and can digitize the measurements to provide a temperature measurement reading (TEMP). In certain examples, the temperature sensor 101 can include a strobe (DN) to indicate when the temperature measurement reading (TEMP) is updated. The temperature measurement reading (TEMP) can include a multiple-bit representation of the temperature measured by the temperature sensor 101.

The token generator (TG) 203 can be triggered by either the strobe (DN) of the temperature sensor 101 or by some other signal such as a clock or oscillator signal. In certain examples, upon a trigger signal, the token generator 203 can generate and output one or more individual tokens. A given token can be associated with one of the multiple reference circuits. In certain examples, a single token of a sequence of tokens can be generated on a trigger signal. In some examples, a series of tokens can be serially generated upon reception of a trigger signal. As discussed below, each token can initiate providing a temperature trim code to a respective reference circuit.

The string 204 of multiple primary latch circuits ($TC_x$) can store predetermined temperature trim codes specific to a respective reference circuit. The trim codes can be multiple-bit codes and can generally have more than 4-bits for each code. Each primary latch circuit ($TC_x$) includes multiple temperature trim codes. Each temperature trim code of an individual primary latch circuit can correspond to a particular temperature. In certain examples, the temperature trim codes are indexed by a code representative of a particular temperature. As an example, each primary latch circuit can include 21 temperature trim codes for a particular reference circuit (e.g., n=21). The 21 temperature trim codes, as an example, can correspond to each 8 degree temperature value from −40° C. to +120° C. The 21 temperature trim codes, or each preprogrammed temperature trim code set, of each primary latch circuit can be programmed during testing of the IC and each preprogrammed temperature trim code set can be specific to the corresponding reference circuit.

In addition to the preprogrammed trim code set, each primary latch circuit can include logic responsive to the token and to inputs received from, for example, a preceding primary latch circuit of the string 204 of primary latch circuits. For given token, one primary latch circuit ($TC_x$) can pass its own preprogrammed temperature trim code set to the outputs of the one primary latch circuit. For that same given token, all the other primary latch circuits ($TC_x$) can pass-thru inputs received from the immediately preceding primary latch circuit ($TC_x$) of the string 204 of primary latch circuits. As such, for the given token, a single preprogrammed temperature trim code set is passed to the inputs of the multiplexer 205. The terminal primary latch circuit (e.g., $TC_0$), within the string of primary latch circuits, furthest from the multiplexer can have its inputs terminated to an inactive state.

The multiplexer 205 can receive the preprogrammed temperature trim code set discussed above from the string 204 of primary latch circuits ($TC_x$) and the digital representation of the measured temperature (TEMP) from the temperature sensor 101. Using both of these inputs, the multiplexer 205 can pass the two preprogrammed temperature trim codes that are closest to the received digital representation of the measured temperature (TEMP) to the interpolator 206. In certain examples, the multiplexer 204 can receive a strobe (DN) from the temperature sensor 101 and can update the multiplexer outputs on a condition of the strobe such as on a particular transition or a particular level of the strobe. In certain examples, such conditioning on the strobe of the temperature sensor can assure that the representation of the measured temperature (TEMP) is valid.

The interpolator 206 can receive the two temperature trim codes provided from the output of the multiplexer 205 and can generate a single trim code for the reference circuit corresponding to the given token. In certain examples, the interpolator interpolates the single trim code using conventional interpolation algorithms. In some examples, such as when the trim codes and the representation of the measured temperature are at least 5 bits in length, the interpolation can be executed according to the following algorithm or formula:

$$TC_C = (TEMP * TC_A + (TC_B * (8 - TEMP)))/8,$$

where $TC_A$ and $TC_B$ are the preprogrammed trim codes received at the interpolator 206 and $TC_C$ is the single trim code generated by the interpolator 206. Upon generation of the single trim code by the interpolator 206, the single trim code can be distributed to a local latch circuit at, near, or associated with the corresponding reference circuit.

In certain examples, the output of the interpolator 206 can be routed to a second multiplexer (not shown) and distributed via a dedicated bus to a corresponding reference circuit based on the given token. In some examples, the output of the interpolator 206 can be a bus common to the local latches associated with the reference circuits and the trim code can be received by the proper local latch based on the given token that can also be placed on the common bus. In some examples, the output of the interpolator 206 can be routed to a serial communication bus controller and the trim code and given token can be broadcast over a serial communication bus coupled to the local latches.

Figure 3:
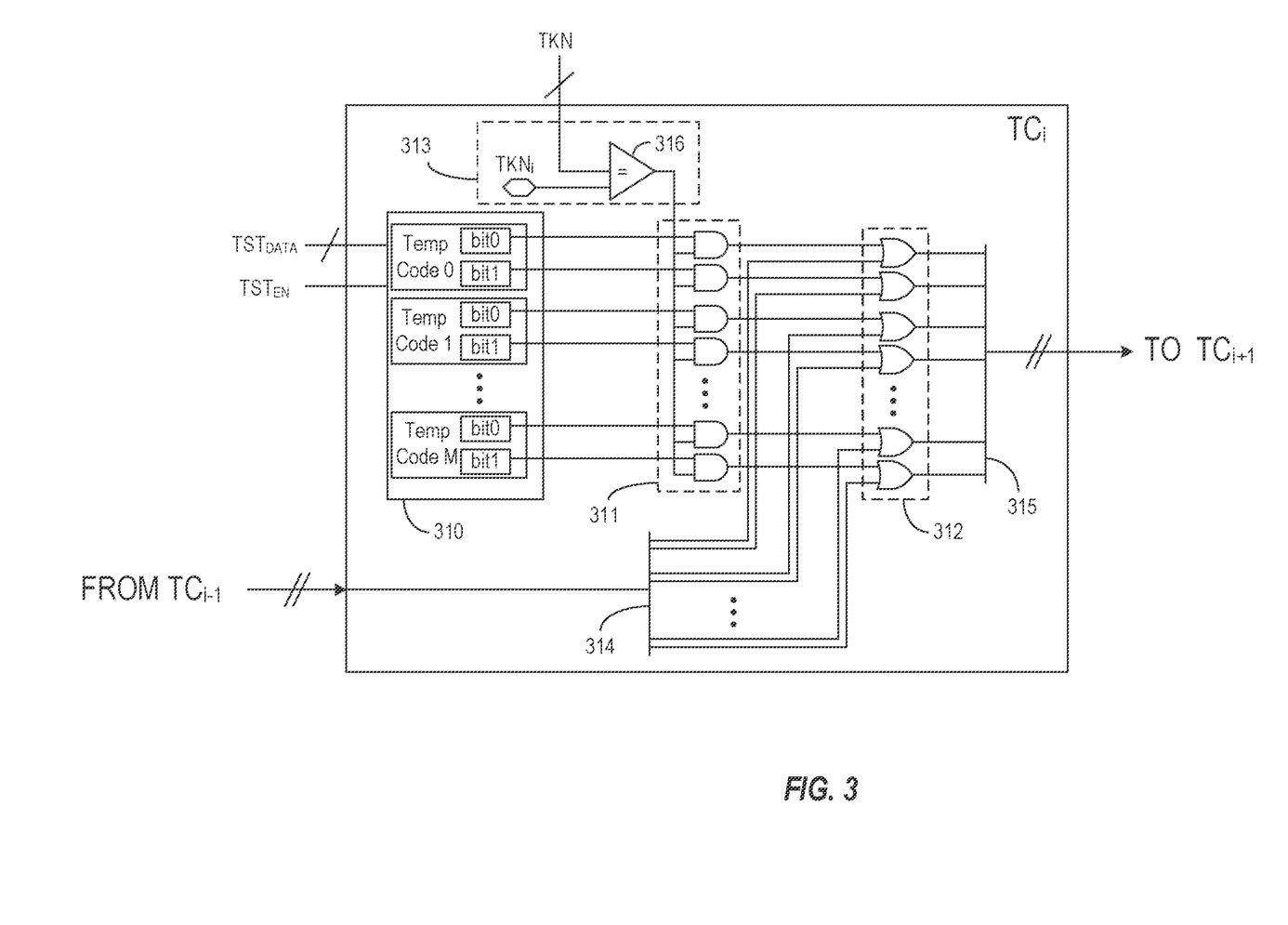
FIG. 3 illustrates generally an example primary latch circuit according to the present subject matter.

FIG. 3 illustrates generally an example primary latch circuit ($TC_i$) where 0<=i<=n, according to the present subject matter. The example primary latch circuit ($TC_i$) illustrates 2-bit trim codes (Temp Code X; 0<=X<=M) or only two bits (e.g., bit0, bit1) of larger bit count trim codes for simplicity. It is understood that sophisticated circuits generally employ trim codes of more than four bits. The primary latch circuit ($TC_i$) can include a latch array 310, an AND-gate circuit 311, an OR-gate circuit 312, and a token detection circuit 313. The primary latch circuit ($TC_i$) can include a first input interface 314 and an output interface 315. Each of the first interface 314 and the output interface 315 can have a width equal to the product of the number of preprogramed temperature codes within a preprogrammed temperature trim code set and the number of bits in a preprogrammed trim code. For example, if each set of predetermined trim codes included 21 codes, and each code is six bits wide, the first interface 314 and the output interface 315 can be at least 126 bits wide. The first input interface 314 is generally connected to the output interface of a neighboring primary latch circuit ($TC_{i-1}$). The output interface 315 is generally connected to the first input interface of a second neighboring primary latch circuit ($TC_{i+1}$). If the primary latch circuit ($TC_i$) is a terminal primary latch circuit (e.g., i=0) located farthest from the multiplexer with respect to the string of primary latch circuits, the first input interface 314 can be terminated to an inactive state. If the primary latch circuit ($TC_i$) is a terminal primary latch circuit located closest to the multiplexer (e.g., i=n) with respect to the string of primary latch circuits, the output interface 315 can be coupled to the input of the multiplexer. The primary latch circuit (XCi) can also have a second input interface 315 coupled to the token generator for receiving the tokens.

As discussed above, the primary latches can be programmed with temperature trim codes (TEMP CODE x) specific to the corresponding reference circuit during testing of the IC. Each primary latch circuit can include one or more test-mode control inputs ($TST_{EN}$) and test-mode data inputs ($TST_{DATA}$) to assist in preprogramming the temperature trim codes (TEST CODE x). It is understood that other techniques for preprogramming each primary latch circuit are possible without departing from the scope of the present subject matter. The preprogrammed temperature trim codes (Temp Code x) can be stored with some type of memory, such as types of non-volatile memory including, but not limited to, programmable fuses, non-volatile latches, etc.

During operation, the token generator can generate reoccurring series of tokens and the temperature sensor can generate the representation of the measured temperature (TEMP). Each latch circuit can include a token reference that ($TKN_i$) identifies the individual primary latch circuit and optionally identifies the reference circuit corresponding to the individual primary latch circuit. In certain examples, the token reference ($TKN_i$) can also be programmed using a test mode. In certain examples, the token reference ($TKN_i$) can be a digital value. In some examples the token reference ($TKN_i$) can be an analog reference. A comparator 316 can compare the generated tokens (TKN) with the token reference ($TKN_i$) and can generate a binary output, a token match indication, indicative of the comparison.

The AND-gate circuit 311 can use the output of the comparator 316 to determine whether to pass the preprogrammed temperature trim code set towards the output interface 315 of the primary latch circuit ($TC_i$). If the generated token (TKN) is equal to the token reference ($TKN_i$), the value of each bit latch containing the preprogrammed temperature trim code set can be passed by the AND-gate circuit 311.

The OR-gate circuit 312 sets the value of each temperature trim code bit of the output interface 315 of the current primary latch circuit ($TC_i$). In general, the OR-gate circuit 312 OR's the AND-gated bits of the current primary latch circuit ($TC_i$) with the output bits of the preceding primary latch circuit ($TC_{i-1}$). The outputs of the preceding primary latch circuit ($TC_{i-1}$) can be active when the generated token (TKN) is equal to a reference token ($TKN_X$) of any preceding primary latch circuit within the chain of primary latch circuits. If the generated token (TKN) does not match any reference tokens ($TKN_X$) of a preceding primary latch circuit, the state of the bits of the first input interface 314 of the current primary latch circuit ($TC_i$) can be inactive. If the current generated token (TKN) also does not equal the reference token ($TKN_i$) of the current primary latch circuit ($TC_i$), the state of the bits of the output interface 312 of the current primary latch circuit ($TC_i$) can also be inactive. If the current generated token (TKN) equals the reference token ($TKN_i$) of the current primary latch circuit ($TC_i$), the state of the bits of the output interface 312 of the current primary latch circuit ($TC_i$) can be set to the state of the bits of the preprogrammed temperature trim code set of the current primary latch circuit ($TC_i$). For the illustrated example of FIG. 3, the inactive state may be a state where all bits of an interface are driven to a low logic level, and an active state is a state where at least some of the bits of an interface are not driven to a high logic level. It is understood that the combination of logic gates and signal levels of the active and inactive states can be different than the examples illustrated and not depart from the scope of the present subject matter.

Trim code architecture examples according to the present subject matter, that allow for a serial connected string of primary latch circuits, can employ a single N:2 multiplexer and a single interpolator to generate individual temperature trim codes to multiple reference circuits. As such, the example trim architecture can save significant IC area and peak power as only a single N:2 multiplexer and a single interpolator are consuming peak energy at any point in time compared to the potential of having all the multiplexers and all the interpolators of a conventional technique consuming peak energy at the same time.

Figure 4:
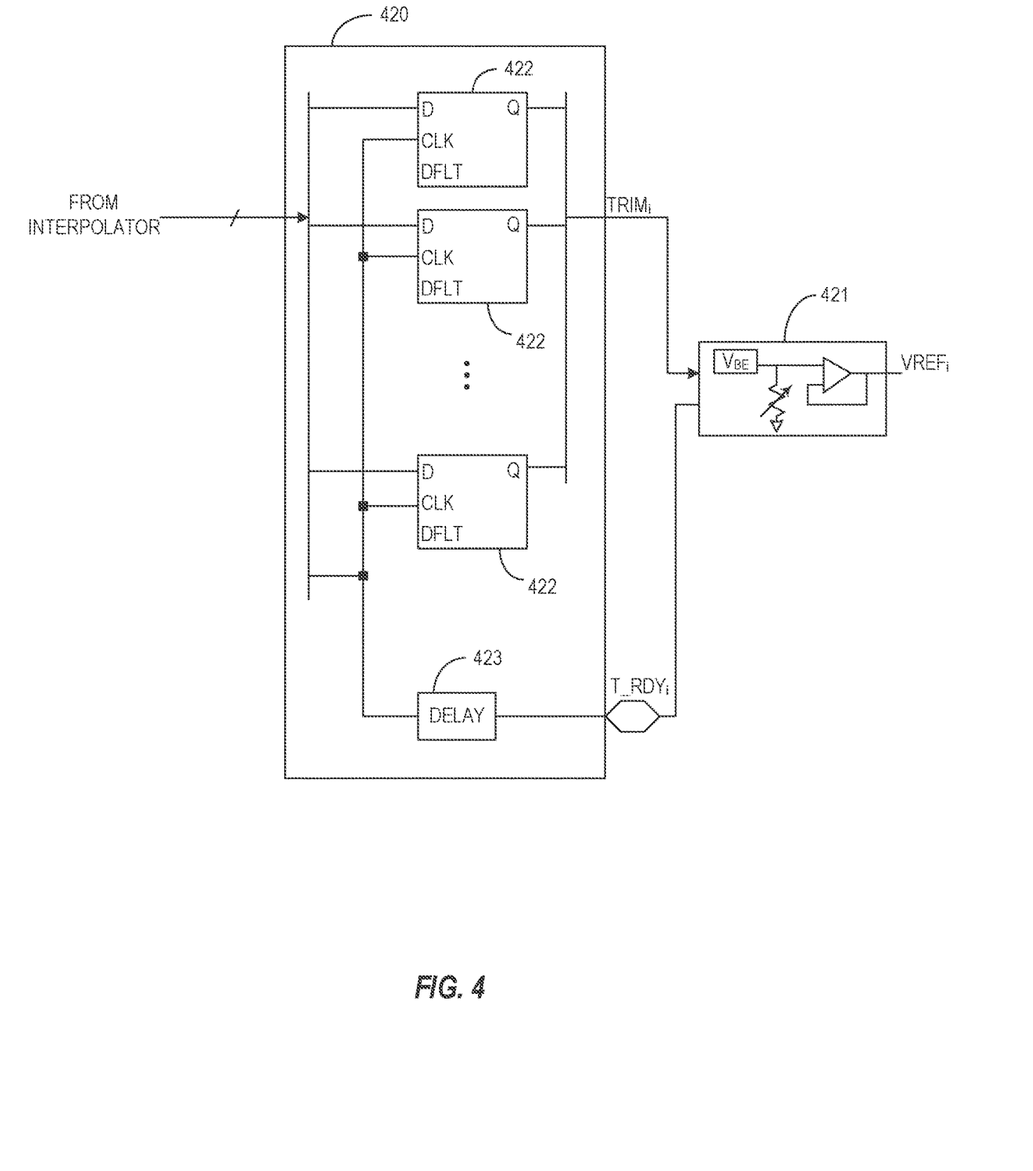
FIG. 4 illustrates generally an example of a local latch circuit and a corresponding reference circuit.

FIG. 4 illustrates generally an example of a local latch circuit 420 and a corresponding reference circuit 421. The local latch circuit 420 can include multiple individual latches 422 such as D-type latches and control logic 423. The multiple individual latches 422 can hold the bit values of an interpolated temperature trim code received from the interpolator. In addition, once loaded, the multiple individual latches 422 can output the interpolated temperature trim code to the corresponding reference circuit 421, such as a voltage reference circuit to provide a reference voltage ($VREF_i$). In some examples, each latch 422 can have a programmable default reset value so as to allow each reference circuit 421 to receive an individual default temperature trim code when needed, such as at start-up or during a fault condition. In the illustrated example, the control logic 423 can include a delay circuit (DELAY) and can be responsive to a control signal received from the interpolator or the corresponding primary latch circuit. The control logic 423 can coordinate the loading of the individual latch circuits 422 and providing an indication to the reference circuit 421 when the trim code is valid or when the trim code has changed. The illustrated example of FIG. 4 assumes that the signals generated at the interpolator include an interpolated temperature trim code and an individual control signal (e.g., CLK) for each local latch circuit 422. The control signal for a given local latch can be activated based on the token associated with the corresponding primary latch circuit.

It is understood that the example of FIG. 4 is just one example of many for distributing an interpolated temperature trim code to a local latch circuit 420 and corresponding reference circuit 421, and other distribution techniques are possible without departing from the scope of the present subject matter. For example, instead of providing an individual control signal for each local latch circuit 420 to control the loading of the local latches 422 and the ready indication ($T\_RDY_i$), the interpolator can provide the token value (TKN) to each local latch circuit 420 on a common bus and the control logic 423 of each local latch circuit 420 can compare the token to a token reference at each local latch circuit 420 to initiate and control loading a new temperature trim code into the local latches 422. As an alternative, the local latch circuits 420 can be connected on a serial bus, the interpolator can include a serializer, and each of the local latch circuit 420 can include a de-serializer. Upon interpolating a temperature trim code, the interpolator can communicate the interpolated temperature trim code and the token via the serial bus. The control logic 423 of each local latch circuit 420 can receive and de-serialize each communication from the interpolator, and can determine whether the reserialized token equals a token reference of the local latch circuit 420. When the token received with the serially communicated interpolated temperature trim code matches the token reference, the control logic 423 can load a new interpolated trim code to the local latches 422 and the control logic 423 can generate the trim ready indication ($T\_RDY_i$) for the corresponding reference circuit 421 when new trim code ($TRIM_i$) is valid. When the token received with the serially communicated interpolated temperature trim code does not match the token reference, the associated trim code can be ignored by that local latch circuit.

Figure 5:
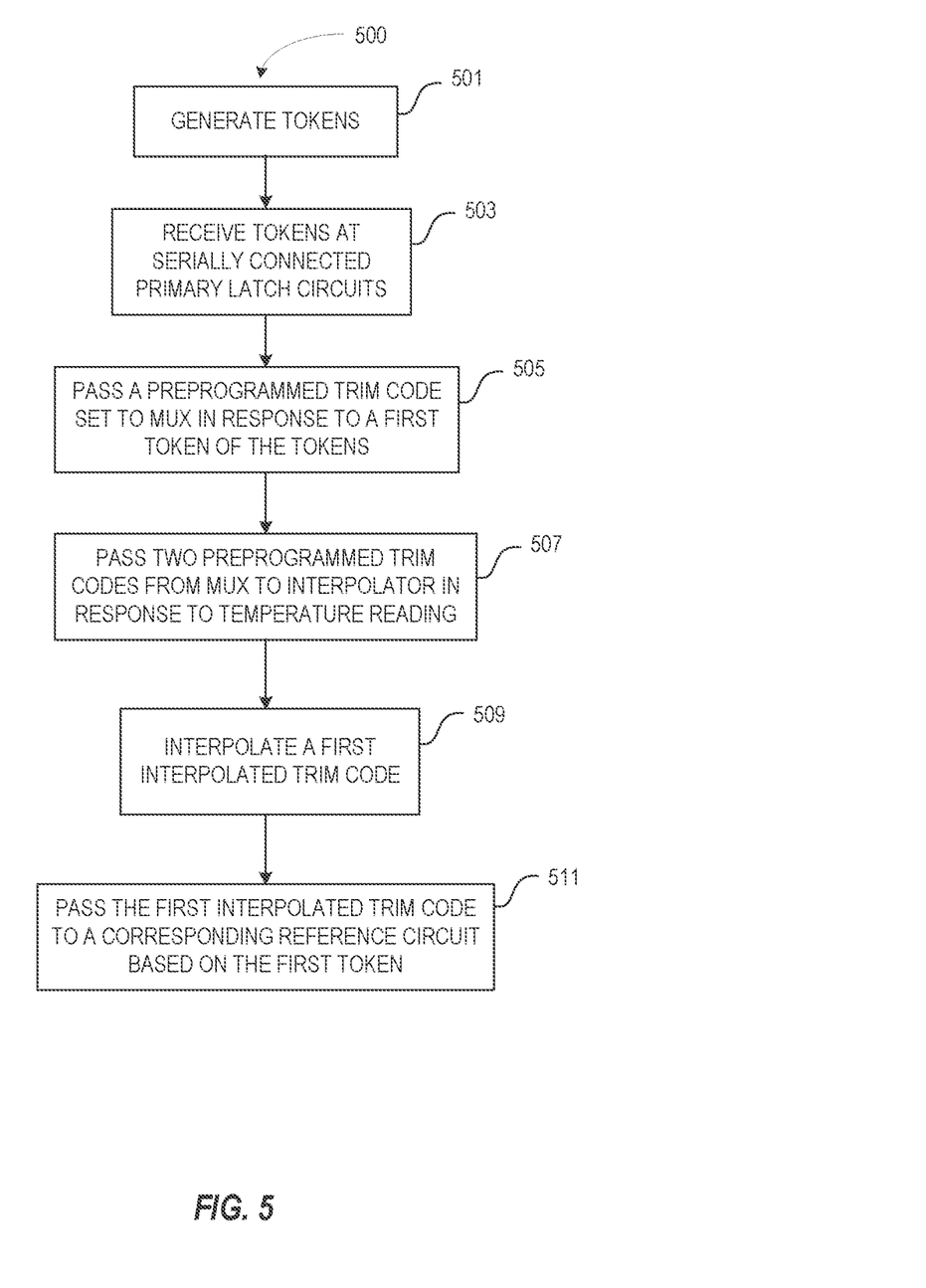
FIG. 5 illustrates generally a method of operating a temperature trim architecture including serially connected primary latch circuits.

FIG. 5 illustrates generally a method of operating a temperature trim architecture including serially connected primary latch circuits. At 501, a series of tokens can be generated. In certain examples, the generation of the tokens can be initiated by a signal received from a temperature sensor indicating the temperature sensor has valid temperature data available. In some examples, the generation of the tokens can be initiated by a clock. At 503, the tokens can be received at each latch circuit of multiple serial connected primary latch circuits. The chain of serial connected primary latch circuits can be connected to an input of a multiplexer. At 505, in response to a first token, a first set of preprogrammed temperature trim codes of a first latch circuit can be passed to the input of the multiplexer via at least one other latch circuit. At 507, the interpolator can pass two preprogrammed temperature trim codes of the first set to an output of the multiplexer based on a temperature reading of the temperature sensor. At 509, a first interpolated trim code can be interpolated from the two preprogrammed temperature trim codes. Upon completing the interpolation, at 511, the first interpolated trim code can be passed to a corresponding local latch that is associated with a corresponding reference circuit.

In certain examples, upon interpolating the first interpolated temperature trim code, a second token can be generated and the method can continue. When a token is generated that corresponds to the last primary latch in the string of primary latches, the last primary latch can pass its set of predetermined temperature trim codes directly to the input of the multiplexer without passing the set through one of the other primary latches of the serially connected string of primary latches. In certain examples, upon starting up an IC with an example temperature trim architecture as discussed above, each local latch can pass a default trim code to a respective reference circuit. An individual default trim code can be preprogrammed into each local latch in certain examples.

Compared to conventional trim architectures, the present subject matter uses a serial technique that can use a single trim code set multiplexer and a single interpolator to provide individualized, interpolated, temperature trim codes for multiple reference circuits of an IC, can do so without sacrificing overall performance, can reduce IC area dedicated to providing temperature trim to reference circuits by up to 70%, can add additional primary and local latches with minimal circuit changes, and can provide individualized default trim codes at each reference circuit.

Figure 6:
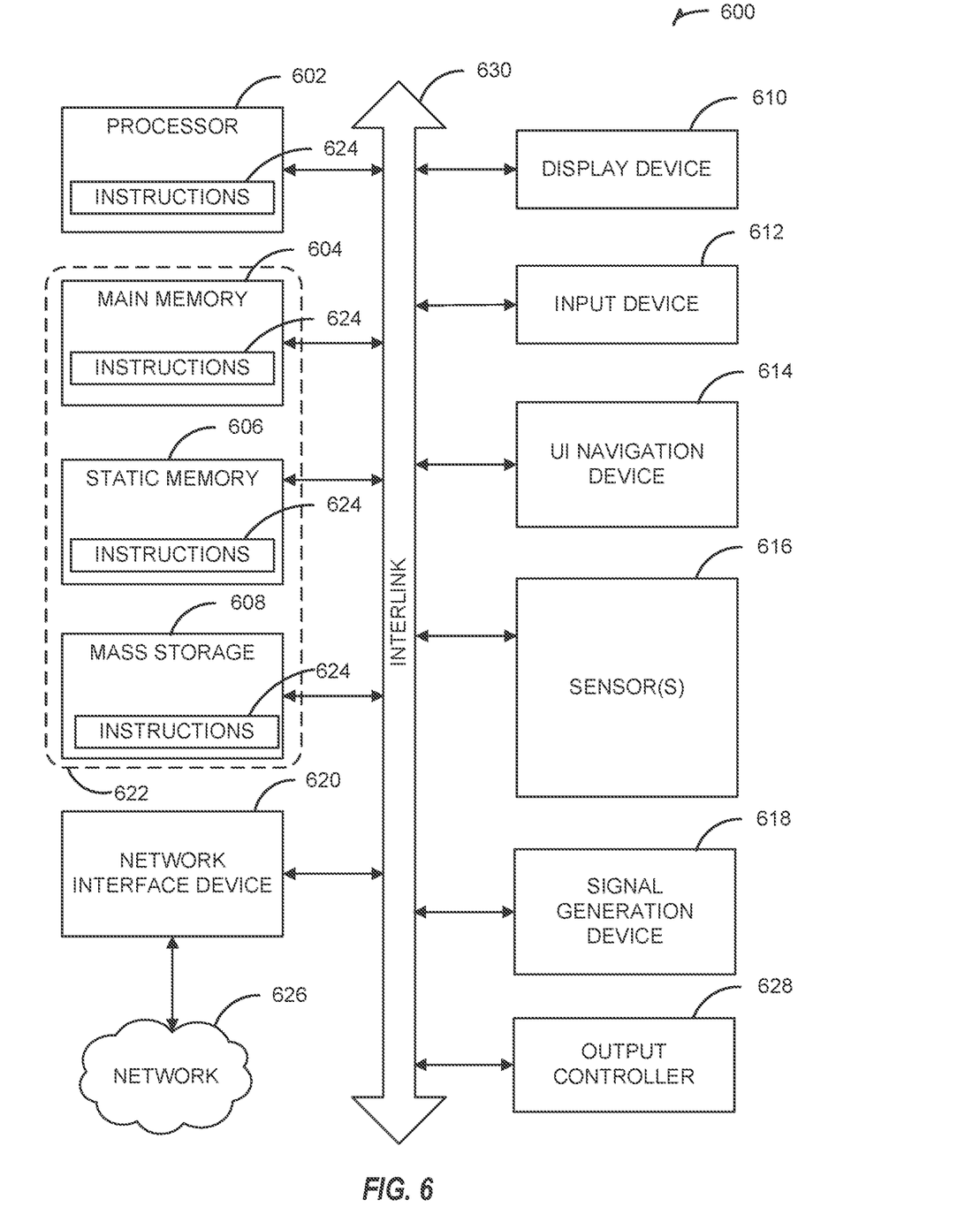
FIG. 6 illustrates a block diagram of an example machine upon which any one or more of the temperature trim techniques (e.g., methodologies) discussed herein can perform.

FIG. 6 illustrates a block diagram of an example machine 600 upon which any one or more of the temperature trim techniques (e.g., methodologies) discussed herein can perform. For example, any of the integrated circuits within machine 600 (main memory 604, static memory 606, and mass storage 608) may implement temperature trim techniques of reference circuits as discussed relative to FIGS. 1-5 herein. In alternative embodiments, the machine 600 can operate as a standalone device or can be connected (e.g., networked) to other machines. In a networked deployment, the machine 600 can operate in the capacity of a server machine, a client machine, or both in server-client network environments. In an example, the machine 600 can act as a peer machine in peer-to-peer (P2P) (or other distributed) network environment. The machine 600 can be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, can include, or can operate by, logic, components, devices, packages, or mechanisms.

Circuitry is a collection (e.g., set) of circuits implemented in tangible entities that include hardware (e.g., simple circuits, gates, logic, etc.). Circuitry membership can be flexible over time and underlying hardware variability. Circuitries include members that can, alone or in combination, perform specific tasks when operating. In an example, hardware of the circuitry can be immutably designed to carry out a specific operation (e.g., hardwired). In an example, the hardware of the circuitry can include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer readable medium is communicatively coupled to the other components of the circuitry when the device is operating. In an example, any of the physical components can be used in more than one member of more than one circuitry. For example, under operation, execution units can be used in a first circuit of a first circuitry at one point in time and reused by a second circuit in the first circuitry, or by a third circuit in a second circuitry at a different time.

The machine (e.g., computer system) 600 (e.g., the host device 105, the memory device 110, etc.) can include a hardware processor 602 (e.g., a central processing unit (CPU), a graphics processing unit (GPU), a hardware processor core, or any combination thereof, such as the memory controller 115, etc.), a main memory 604 and a static memory 606, some or all of which can communicate with each other via an interlink (e.g., bus) 630. The machine 600 can further include a display unit 610, an alphanumeric input device 612 (e.g., a keyboard), and a user interface (UI) navigation device 614 (e.g., a mouse). In an example, the display unit 610, input device 612 and UI navigation device 614 can be a touch screen display. The machine 600 can additionally include a storage device (e.g., drive unit) 608, a signal generation device 618 (e.g., a speaker), a network interface device 620, and one or more sensors 616, such as a global positioning system (GPS) sensor, compass, accelerometer, or other sensor. The machine 600 can include an output controller 628, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 616 can include a machine readable medium 622 on which is stored one or more sets of data structures or instructions 624 (e.g., software) embodying or utilized by any one or more of the techniques or functions described herein. The instructions 624 can also reside, completely or at least partially, within the main memory 604, within static memory 606, or within the hardware processor 602 during execution thereof by the machine 600. In an example, one or any combination of the hardware processor 602, the main memory 604, the static memory 606, or the storage device 608 can constitute the machine readable medium 622.

While the machine readable medium 622 is illustrated as a single medium, the term "machine readable medium" can include a single medium or multiple media (e.g., a centralized or distributed database, or associated caches and servers) configured to store the one or more instructions 624.

The term "machine readable medium" can include any medium that is capable of storing, encoding, or carrying instructions for execution by the machine 600 and that cause the machine 600 to perform any one or more of the techniques of the present disclosure, or that is capable of storing, encoding or carrying data structures used by or associated with such instructions. Non-limiting machine readable medium examples can include solid-state memories, and optical and magnetic media. In an example, a massed machine readable medium comprises a machine-readable medium with a plurality of particles having invariant (e.g., rest) mass. Accordingly, massed machine-readable media are not transitory propagating signals. Specific examples of massed machine readable media can include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 624 (e.g., software, programs, an operating system (OS), etc.) or other data are stored on the storage device 608, can be accessed by the memory 604 for use by the processor 602. The memory 604 (e.g., DRAM) is typically fast, but volatile, and thus a different type of storage than the storage device 608 (e.g., an SSD), which is suitable for long-term storage, including while in an "off" condition. The instructions 624 or data in use by a user or the machine 600 are typically loaded in the memory 604 for use by the processor 602. When the memory 604 is full, virtual space from the storage device 608 can be allocated to supplement the memory 604; however, because the storage 608 device is typically slower than the memory 604, and write speeds are typically at least twice as slow as read speeds, use of virtual memory can greatly reduce user experience due to storage device latency (in contrast to the memory 604, e.g., DRAM). Further, use of the storage device 608 for virtual memory can greatly reduce the usable lifespan of the storage device 608.

In contrast to virtual memory, virtual memory compression (e.g., the Linux® kernel feature "ZRAM") uses part of the memory as compressed block storage to avoid paging to the storage device 608. Paging takes place in the compressed block until it is necessary to write such data to the storage device 608. Virtual memory compression increases the usable size of memory 604, while reducing wear on the storage device 608.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 624 can further be transmitted or received over a communications network 626 using a transmission medium via the network interface device 620 utilizing any one of a number of transfer protocols (e.g., frame relay, internet protocol (IP), transmission control protocol (TCP), user datagram protocol (UDP), hypertext transfer protocol (HTTP), etc.). Example communication networks can include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 620 can include one or more physical jacks (e.g., Ethernet, coaxial, or phone jacks) or one or more antennas to connect to the communications network 626. In an example, the network interface device 620 can include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 600, and includes digital or analog communications signals or other intangible medium to facilitate communication of such software.

ADDITIONAL EXAMPLES

In a first example, Example 1, a temperature trim architecture for an integrated circuit (IC) can include a string of primary latch circuits configured to pass a set of preprogrammed trim codes to an output of the string, the set of preprogrammed trim codes based on a first token received at each of the primary latch circuits of the string, a multiplexer coupled to the output of the string, the multiplexer configured to receive a temperature measurement and to pass at least two temperature trim codes of the set of preprogrammed trim codes to an output of the multiplexer, and an interpolator configured to receive the at least two temperature trim codes and to interpolate a first output trim code based on the temperature measurement and the at least two trim codes.

In Example 2, the architecture of Example 1 optionally includes multiple local latch circuits, wherein a first local latch circuit of the multiple of local latch circuits is configured to receive the first output trim code from the interpolator.

In Example 3, the first local latch circuit of any one or more of Examples 1-2 optionally is configured to pass the first output trim code to a corresponding reference circuit.

In Example 4, the first local latch circuit of any one or more of Examples 1-3 optionally includes control circuitry configured to determine whether the first token corresponds to the first local latch circuit and a corresponding reference circuit coupled with the first local latch, to pass the first output trim code to the corresponding reference circuit when the first token corresponds to the corresponding reference circuit, and to not pass the first trim code when the first token does not correspond to the first local latch.

In Example 5, a first primary latch circuit of the string of primary latch circuits of any one or more of Examples 1~4 optionally includes multiple latches configured to store the set of preprogrammed temperature trim codes, and a token detection circuit configured to determine whether the first token corresponds to the first primary latch, to pass the set of preprogrammed temperature trim codes in response to the first token corresponding to the first primary latch, and to pass states of an input interface of the first primary latch in response to the first token not corresponding to the first primary latch.

In Example 6, the token detection circuit of any one or more of Examples 1-5 optionally includes an first gate circuit configured to pass the set of preprogrammed temperature trim codes when the first token corresponds to the first primary latch, and to pass a states of an input interface when the first token does not correspond to the first primary latch circuit.

In Example 7, the token detection circuit of any one or more of Examples 1-6 optionally includes an second gate circuit configured to pass the set of preprogrammed temperature trim codes from the multiple latches to the first gate circuit when the first token corresponds to the first primary latch, and to not pass the set of preprogrammed temperature trim codes from the multiple latches to the first gate circuit when the first token does not correspond to the first primary latch circuit.

In Example 8, a circuit can include a token generator configured to provide serially generated tokens, multiple primary latch circuits, each associated with a respective reference circuit of multiple reference circuits, arranged in a sequential chain, wherein a first primary latch circuit of the multiple primary latch circuits is configured to pass a first set of predetermined temperature trim codes to an output of the first primary latch circuit in response to a first token of the serially generated tokens, the first set corresponding to a first respective reference circuit of multiple reference circuits, and to pass a second set of predetermined trim codes received from a preceding primary latch circuit of the sequential chain to the output of the first primary latch circuit in response to a second token of the serially generated tokens, a multiplexer coupled to an output of a last primary latch circuit of the sequential chain, the multiplexer configured to receive a temperature measurement and to pass at least two temperature trim codes of the first set of predetermined temperature trim codes to an output of the multiplexer, and an interpolator configured to receive the at least two temperature trim codes and to interpolate an output trim code based on the temperature measurement and the at least two trim codes.

In Example 9, the token generator of any one or more of Examples 1-8 optionally is configured to sequentially generate series of tokens, wherein each series of tokens include a token configured to match a reference token of each latch circuit of the multiple latch circuits.

In Example 10, the multiple reference circuits of any one or more of Examples 1-9 optionally include multiple voltage reference circuits.

In Example 11, each primary latch includes of any one or more of Examples 1-10 optionally multiple trim codes indexed by a discrete temperature of a range of temperatures.

In Example 12, each latch circuit of any one or more of Examples 1-11 optionally includes a first gate responsive to the serially generated tokens, and a second gate responsive to active outputs of a preceding latch circuit.

In Example 13, a method can include serially generating a series of tokens, receiving the series of tokens at multiple latch circuits connected in series to an input of a multiplexer, serially passing first stored temperature trim codes of a first latch circuit of the multiple latch circuits to the input of the multiplexer, via at least one other latch circuit of the multiple latch circuits, in response to a first token of the series of tokens, passing two temperature trim codes of the first stored trim codes to an output of the multiplexer in response to a temperature measurement, and interpolating a first reference trim code from the two temperature trim codes.

In Example 14, the method of any one or more of Examples 1-2 optionally includes serially passing second stored temperature trim codes of a second latch circuit of the multiple latch circuits to the input of the multiplexer in response to a second token of the series of tokens.

In Example 15, the method of any one or more of Examples 1-14 optionally includes optionally receiving the first reference trim code at a first reference circuit and trimming a first reference generated by the first reference circuit based on the first reference trim code.

In Example 16, the serially passing first stored temperature trim codes of any one or more of Examples 1-15 optionally includes deactivating outputs of a latch of each latch circuit of the multiple latch circuits prior to receiving the first token.

In Example 17, the serially passing first stored temperature trim codes of any one or more of Examples 1-16 optionally includes comparing the first token with a token reference of each of the multiple latch circuits to provide a token match indication for each latch circuit of the multiple latch circuits, and AND-ing the outputs of the latch of each latch circuit of the multiple latch circuits with the token match indication.

In Example 18, the serially passing first stored temperature trim codes of any one or more of Examples 1-17 optionally includes OR-ing the outputs of the latch of all but one latch circuit of the multiple latch circuits with the outputs of a preceding latch circuit of multiple latch circuits coupled in series.

In Example 19, the method of any one or more of Examples 1-18 optionally includes transmitting the first reference trim code to multiple reference circuits over a bus having a width commensurate with a width of the first reference trim code.

In Example 20, the method of any one or more of Examples 1-19 optionally includes transmitting the first reference trim code to multiple reference circuits over a bus having a width commensurate with a width of the first reference trim code and the token.

In Example 21, the method of any one or more of Examples 1-20 optionally includes transmitting the first reference trim code to multiple reference circuits over a serial communication bus.

Example 22 is at least one machine-readable medium including instructions that, when executed by processing circuitry, cause the processing circuitry to perform operations to implement of any of Examples 1-21.

Example 23 is an apparatus comprising means to implement of any of Examples 1-21.

Example 24 is a system to implement of any of Examples 1-21.

Example 25 is a method to implement of any of Examples 1-21.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" can include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The term "horizontal" as used in this document is defined as a plane parallel to the conventional plane or surface of a substrate, such as that underlying a wafer or die, regardless of the actual orientation of the substrate at any point in time. The term "vertical" refers to a direction perpendicular to the horizontal as defined above. Prepositions, such as "on," "over," and "under" are defined with respect to the conventional plane or surface being on the top or exposed surface of the substrate, regardless of the orientation of the substrate; and while "on" is intended to suggest a direct contact of one structure relative to another structure which it lies "on" (in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under" are not limited to horizontal orientations, as a structure can be "over" a referenced structure if it is, at some point in time, an outermost portion of the construction under discussion, even if such structure extends vertically relative to the referenced structure, rather than in a horizontal orientation.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

As used herein, directional adjectives, such as horizontal, vertical, normal, parallel, perpendicular, etc., can refer to relative orientations, and are not intended to require strict adherence to specific geometric properties, unless otherwise noted. For example, as used herein, a vertical structure need not be strictly perpendicular to a surface of a substrate, but can instead be generally perpendicular to the surface of the substrate, and can form an acute angle with the surface of the substrate (e.g., between 60 and 120 degrees, etc.).

Operating a memory cell, as used herein, includes reading from, writing to, or erasing the memory cell. The operation of placing a memory cell in an intended state is referred to herein as "programming," and can include both writing to or erasing from the memory cell (e.g., the memory cell can be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device can be configured to provide wear cycle information to the memory device with each memory operation. The memory device control circuitry (e.g., control logic) can be programmed to compensate for memory device performance changes corresponding to the wear cycle information. The memory device can receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements can be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code can form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMS), read only memories (ROMs), solid state drives (SSDs), Universal Flash Storage (UFS) device, embedded MMC (eMMC) device, and the like.

The above description is intended to be illustrative, and not restrictive. For example, the above-described examples (or one or more aspects thereof) can be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A memory device comprising:
    a semiconductor device having one or more temperature sensors; and
    temperature trim circuitry, including,
        a string of series-connected primary latch circuits configured to sequentially pass a set of preprogrammed trim codes through the series-connected primary latch circuits in the string and to an output of the string, the set of preprogrammed trim codes based on a token received at respective primary latch circuits of the string;
        a multiplexer coupled to the output of the string, the multiplexer configured to receive at least one temperature measurement from at least one of the temperature sensors, and to pass at least two temperature trim codes of the set of preprogrammed trim codes to an interpolator; and
        the interpolator configured to receive the at least two temperature trim codes and to interpolate an output trim code based on the at least one temperature measurement and the at least two temperature trim codes.

2. The memory device of claim 1, including multiple local latch circuits, wherein a first local latch circuit is configured to receive the first output trim code from the interpolator.

3. The memory device of claim 2, wherein the first local latch circuit is associated with a corresponding reference circuit.

4. The memory device of claim 2, wherein a first primary latch circuit of the series-connected primary latch circuits includes control circuitry configured to determine whether a token corresponds to the first primary latch circuit and a corresponding reference circuit coupled with the first local latch circuit, and to pass an output trim code to the corresponding reference circuit when the token corresponds to the corresponding reference circuit.

5. The memory device of claim 4, wherein the control circuitry located in the first primary latch circuit is further configured to not pass a trim code from the first primary latch circuit when the token does not correspond to the first primary latch circuit.

6. The memory device of claim 1, wherein a first primary latch circuit of the string of serially-connected primary latch circuits includes multiple latches configured to store the set of preprogrammed temperature trim codes; and further comprising,
a token detection circuit configured to determine whether a token corresponds to the first primary latch circuit, to pass the set of preprogrammed temperature trim codes in response to the token corresponding to the first primary latch.

7. The memory device of claim 6, wherein the token detection circuit includes a first gate circuit configured to pass the set of preprogrammed temperature trim codes when the first token corresponds to a respective primary latch circuit, and to pass a state of an input interface when the first token does not correspond to a respective primary latch circuit.

8. The memory device of claim 7, wherein the token detection circuit includes a second gate circuit configured to pass the set of preprogrammed temperature trim codes from the multiple latches to the first gate circuit when the first token corresponds to the first primary latch, and to not pass the set of preprogrammed temperature trim codes from the multiple latches to the first gate circuit when the first token does not correspond to the first primary latch circuit.

9. A circuit comprising:
a token generator configured to provide serially generated tokens;
multiple primary latch circuits, each associated with a respective reference circuit of multiple reference circuits, the primary latch circuits arranged in a sequential chain, wherein individual primary latch circuits are configured to pass a first set of predetermined temperature trim codes to an output of the individual primary latch circuit in response to a token of the serially generated tokens being directed to such individual latch circuit, and are further configured to pass through to the output of the sequential chain of latch circuits another set of predetermined trim codes received from a preceding primary latch circuit within the sequential chain;
a multiplexer coupled to an output of a last primary latch circuit of the sequential chain, the multiplexer configured to receive a temperature measurement and to pass at least two temperature trim codes of the first set of predetermined temperature trim codes to an output of the multiplexer; and
an interpolator configured to receive the at least two temperature trim codes and to interpolate an output trim code based on the temperature measurement and the at least two trim codes, and to pass the output trim code to a local latch associated with the respective reference circuit.

10. The circuit of claim 9, wherein the token generator is configured to sequentially generate a series of tokens, the series of tokens including a token configured to match a reference token of each primary latch circuit of the multiple primary latch circuits.

11. The circuit of claim 9, wherein each primary latch circuit includes multiple trim codes indexed by a discrete temperature of a range of temperatures.

12. The circuit of claim 9, wherein each primary latch circuit includes:
a first gate responsive to the serially generated tokens; and
a second gate responsive to active outputs of a preceding primary latch circuit.

13. A method of operating a memory device, comprising:
adjusting trim levels of multiple temperature reference circuits of the memory device, the memory device including,
multiple temperature sensors,
multiple reference circuits, each reference circuit including a local latch, and
a string of sequentially arranged primary latch circuits in communication with a token generator, the string of multiple primary latch circuits connected in series to an input of a multiplexer;
wherein the adjusting trim levels includes, through use of the token generator, generating a series of tokens;
receiving the series of tokens at the string of primary latch circuits wherein the tokens of the series of tokens are directed to respective primary latch circuits;
in response to receipt of a first token at a first primary latch circuit, and in response to a temperature measurement from one of the multiple temperature sensors, passing two temperature trim codes of multiple stored trim codes through a multiplexer to an output of the multiplexer;
interpolating a first reference trim code from the two temperature trim codes;
receiving the first reference trim code at a first reference circuit; and
trimming a first reference generated by the first reference circuit based on the first reference trim code.

14. The method of claim 13, further comprising, in response to a second token within the series of tokens, serially passing second stored temperature trim codes of a second primary latch circuit of the multiple primary latch circuits through a sequential primary latch circuit to the input of the multiplexer.

15. The method of claim 13, wherein receiving the first reference trim code at a first reference circuit comprises receiving the interpolated first reference trim code at the local latch of the first reference circuit.

16. The method of claim 13, wherein the serially passing of first stored temperature trim codes includes deactivating outputs of a latch of each primary latch circuit of the multiple primary latch circuits prior to receiving the first token.

17. The method of claim 16, wherein the serially passing first stored temperature trim codes includes:
comparing the first token with a token reference of each of the multiple latch circuits to provide a token match indication for each latch circuit of the multiple latch circuits; and
AND-ing the outputs of the latch of each latch circuit of the multiple latch circuits with the token match indication.

18. The method of claim 17, wherein the serially passing first stored temperature trim codes includes OR-ing the outputs of the latch of all but one latch circuit of the multiple latch circuits with the outputs of a preceding latch circuit of multiple latch circuits coupled in series.

19. The method of claim 13, including transmitting the first reference trim code to multiple reference circuits over a bus having a width commensurate with a width of the first reference trim code and the token.

20. The method of claim 13, wherein the memory device is a ferroelectric random-access memory device (FeRAM).

* * * * *